United States Patent
Lee et al.

(10) Patent No.: US 9,123,914 B2
(45) Date of Patent: Sep. 1, 2015

(54) ELECTRONIC DEVICE AND METHOD OF FABRICATING THE SAME

(71) Applicants: Electronics and Telecommunications Research Institute, Daejeon (KR); Korea Electrotechnology Research Institute, Changwon-si, Gyeongsangnam-do (KR); Korea Institute of Machinery & Materials, Daejeon (KR)

(72) Inventors: Jeong Ik Lee, Daejeon (KR); Jonghee Lee, Daejeon (KR); Doo-Hee Cho, Daejeon (KR); Jun-Han Han, Daejeon (KR); Geon-Woong Lee, Changwon-si (KR); Joong-Tak Han, Changwon-si (KR); Do-Geun Kim, Changwon-si (KR); Sunghoon Jung, Seoul (KR)

(73) Assignees: ELECTRONICS AND TELECOMMUNICATIONS RESEARCH INSTITUTE, Daejeon (KR); KOREA ELECTROTECHNOLOGY RESEARCH INSTITUTE, Changwon-Si, Gyeongsangnam-Do (KR); KOREA INSTITUTE OF MACHINERY & MATERIALS, Daejeon (KR)

( * ) Notice: Subject to any disclaimer, the term of this patent is extended or adjusted under 35 U.S.C. 154(b) by 0 days.

(21) Appl. No.: 14/269,609

(22) Filed: May 5, 2014

(65) Prior Publication Data
US 2015/0008401 A1  Jan. 8, 2015

(30) Foreign Application Priority Data
Jul. 8, 2013  (KR) .................. 10-2013-0079840

(51) Int. Cl.
*H01L 51/52* (2006.01)
*H01L 51/56* (2006.01)

(52) U.S. Cl.
CPC ........ *H01L 51/5275* (2013.01); *H01L 51/5212* (2013.01); *H01L 51/5228* (2013.01); *H01L 51/5268* (2013.01)

(58) Field of Classification Search
None
See application file for complete search history.

(56) References Cited

U.S. PATENT DOCUMENTS 7,560,727 B2 * 7/2009 Ishikawa .................. 257/40
8,013,514 B2 * 9/2011 Park et al. ................. 313/501

(Continued)

FOREIGN PATENT DOCUMENTS

JP   H10-172756 A   6/1998
JP   2005-136318 A  5/2005

(Continued)

OTHER PUBLICATIONS

Machine translation of KR 10-2012-0000402.*

(Continued)

*Primary Examiner* — Joseph Schoenholtz
(74) *Attorney, Agent, or Firm* — Rabin & Berdo, P.C.

(57) ABSTRACT

Provided are an electronic device and a fabrication method thereof. The electronic device according to the concept of the present invention includes auxiliary interconnections disposed on a substrate, a light extraction layer that is provided on the substrate and fills between the auxiliary interconnection, and a first electrode provided on the auxiliary interconnections and the light extraction layer, wherein the light extraction layer may have a first surface facing the substrate and a second surface opposite to the first surface, the first surface may have protrusions, and the auxiliary interconnections may include a material having a lower resistance than the first electrode. Since electrical properties of the electronic device are improved, uniform light emission characteristics may be realized.

19 Claims, 10 Drawing Sheets

(56) References Cited

U.S. PATENT DOCUMENTS

| | | | |
|---|---|---|---|
| 8,828,760 B2* | 9/2014 | Lee et al. | 438/32 |
| 2007/0120136 A1 | 5/2007 | Noda et al. | |
| 2011/0114931 A1* | 5/2011 | Lee et al. | 257/40 |
| 2011/0308589 A1* | 12/2011 | Kataishi et al. | 136/255 |
| 2013/0056711 A1* | 3/2013 | Huh et al. | 257/40 |
| 2013/0181242 A1* | 7/2013 | Cho | 257/98 |
| 2014/0027727 A1* | 1/2014 | Lee et al. | 257/40 |

FOREIGN PATENT DOCUMENTS

| | | | |
|---|---|---|---|
| KR | 10-2005-0001364 A | 1/2005 | |
| KR | 10-2005-0121691 A | 12/2005 | |
| KR | 10-2007-0102947 A | 10/2007 | |
| KR | 10-2008-0020509 A | 3/2008 | |
| KR | 10-2008-0050899 A | 6/2008 | |
| KR | 10-2009-0127680 A | 12/2009 | |
| KR | 10-2010-0008200 A | 1/2010 | |
| KR | 10-2011-0019143 A | 2/2011 | |
| KR | 20120000402 * | 1/2012 | H01L 51/56 |
| KR | 10-1161301 B1 | 7/2012 | |
| KR | 10-1176885 B1 | 8/2012 | |
| KR | 10-1191865 B1 | 10/2012 | |

OTHER PUBLICATIONS

Jong-Su Yu et al., "Transparent conductive film with printable embedded patterns for organic solar cells", Solar Energy Materials & Solar Cells, vol. 109, pp. 142-147, Nov. 22, 2013.

G. Gu et al., "High-external-quantum-efficiency organic light-emitting devices", Optics Letters, vol. 22, No. 6, pp. 396-398, Mar. 15, 1997.

* cited by examiner

ELECTRONIC DEVICE AND METHOD OF FABRICATING THE SAME

CROSS-REFERENCE TO RELATED APPLICATIONS

This U.S. non-provisional patent application claims priority under 35 U.S.C. §119 of Korean Patent Application No. 10-2013-0079840, filed on Jul. 8, 2013, the entire contents of which are hereby incorporated by reference.

BACKGROUND

The present invention disclosed herein relates to electronic devices, and more particularly, to methods of fabricating a substrate for an electronic device.

Recently, in line with the emergence of various environmental issues, a technique using organic light-emitting devices (OLEDs), which do not use heavy metal such as mercury and lead, as a light source has received attention as an eco-friendly advanced lighting technique. An OLED is a self light-emitting device that emits light by electrically exciting an organic light-emitting material. The OLED includes a substrate, an anode, a cathode, and an organic emission layer. The OLED may have excellent display characteristics such as wide viewing angles, fast response speeds, a thin profile, low manufacturing costs, and high contrast. The internal quantum efficiency of a light source may be improved as a technique of the OLED advances. However, the OLED has a limitation in that only about 25% of total luminous power is discharged to the outside of the device and the remaining 75% are isolated within the OLED.

SUMMARY

The present invention provides an electronic device having improved electrical properties.

The present invention also provides an electronic device having uniform light emission characteristics.

The object of the present invention is not limited to the aforesaid, but other objects not described herein will be clearly understood by those skilled in the art from descriptions below.

Embodiments of the present invention provide methods of fabricating an electronic device including: providing a supporting substrate in which auxiliary interconnections are formed; forming a light extraction layer on the substrate, wherein the light extraction layer fills between the auxiliary interconnections, and has a first surface and a second surface that is opposite to the first surface and faces the supporting substrate; forming a substrate on the first surface of the light extraction layer; removing the supporting substrate and exposing the second surface of the light extraction layer; and sequentially forming a first electrode, an intermediate layer, and a second electrode on the second surface of the light extraction layer.

In some embodiments, the removing of the supporting substrate may include exposing the auxiliary interconnections, and the first electrode may be in contact with the auxiliary interconnections and the second surface of the light extraction layer.

In other embodiments, the forming of the light extraction layer may include forming protrusions having an irregular size or shape on the first surface, wherein the protrusions may have a narrower average width than the auxiliary interconnections.

In still other embodiments, the auxiliary interconnections may have: one surface facing the substrate; and another surface that is opposite to the one surface and parallel to the second surface of the light extraction layer.

In even other embodiments, the one surface of the auxiliary interconnections may be spaced apart from the substrate by having a lower level than the first surface of the light extraction layer.

In yet other embodiments, a refractive index of the light extraction layer may be in a range of 1.7 to 2.1.

In further embodiments, the light extraction layer may have a lower height than the auxiliary interconnections, and the auxiliary interconnections may be in contact with the substrate by extending to the substrate.

In still further embodiments, the forming of the substrate may further include forming a planarizing layer covering the first surface of the light extraction layer.

In even further embodiments, a refractive index of the planarizing layer may be in a range of 1.3 to 1.7.

In yet further embodiments, the forming of the light extraction layer may include: forming a composite material layer on the supporting substrate; forming a metal layer covering the composite material layer; forming a mask exposing the composite material layer by heat treating the metal layer; and forming the protrusions by etching the composite material layer.

In other embodiments of the present invention, electronic devices include: a substrate; auxiliary interconnections disposed on the substrate; a light extraction layer that is provided on the substrate and fills between the auxiliary interconnections; a first electrode provided on the auxiliary interconnections and the light extraction layer; and an intermediate layer and a second electrode that are sequentially stacked on the first electrode, wherein the light extraction layer may have a first surface facing the substrate and a second surface opposite to the first surface, the first surface may have protrusions, and the auxiliary interconnections may include a material having a lower resistance than the first electrode.

In some embodiments, the first electrode may be in contact with the auxiliary interconnections and the light extraction layer, and the light extraction layer may expose an uppermost surface of the auxiliary interconnections.

In other embodiments, the protrusions may have an irregular shape, size, or interval.

In still other embodiments, a width of the auxiliary interconnections may be greater than an average width of the protrusions.

In even other embodiments, a lowermost surface of the auxiliary interconnections may be spaced apart from the substrate.

In yet other embodiments, the second surface may have a higher level than the lowermost surface of the auxiliary interconnections, and the auxiliary interconnections may be in contact with the substrate by extending into the substrate.

In further embodiments, the electronic device may further include a functional layer disposed between the first electrode and the intermediate layer, wherein the first electrode may extend between the auxiliary interconnections.

In still further embodiments, a refractive index of the light extraction layer may be in a range of 1.7 to 2.1.

In even further embodiments, the electronic device may further include a planarizing layer that is disposed between the substrate and the light extraction layer to cover the protrusions, wherein a refractive index of the planarizing layer may be in a range of 1.3 to 1.7.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF THE EMBODIMENTS

Figure 1:
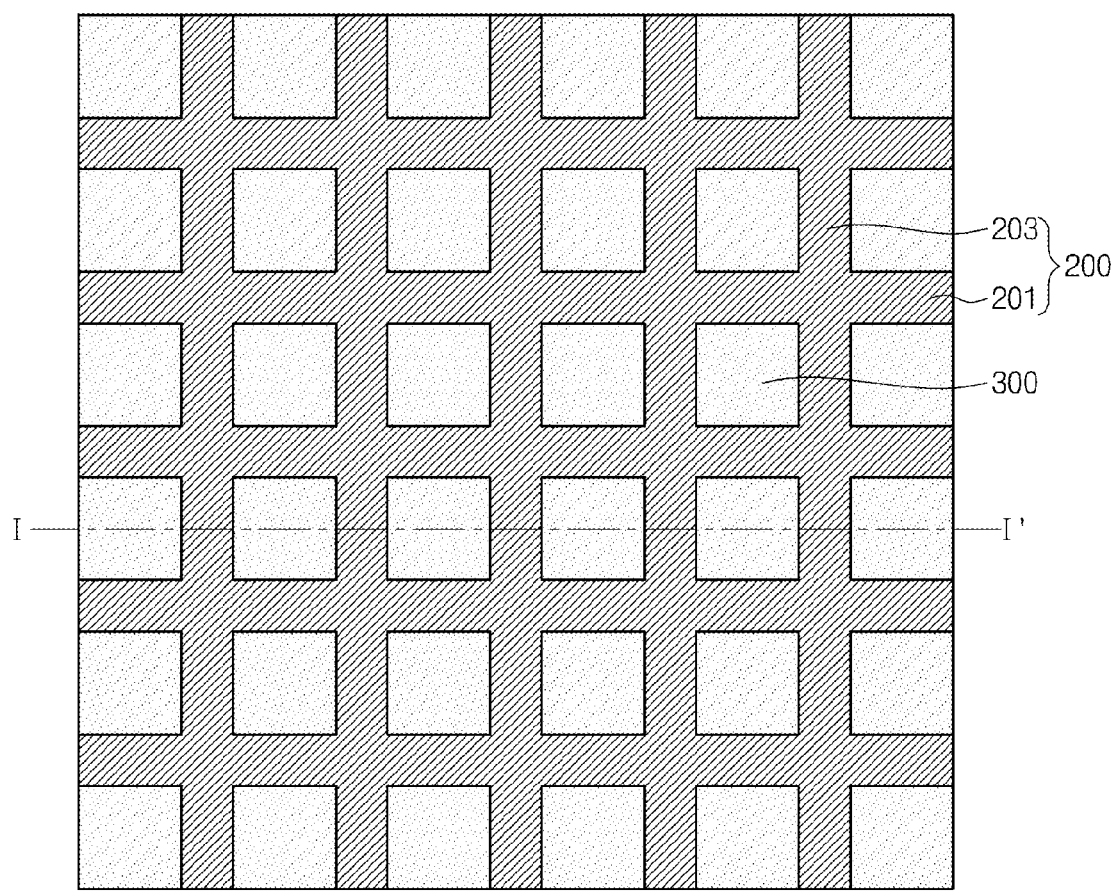
FIG. 1 is a plan view illustrating an electronic device according to an embodiment of the present invention.

Preferred embodiments of the present invention will be described below in more detail with reference to the accompanying drawings in order to fully understand the constitution and effect of the present invention. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Those skilled in the art will understand that the present inventive concept can be implemented in an appropriate environment.

In the following description, the technical terms are used only for explaining a specific exemplary embodiment while not limiting the present invention. The terms of a singular form may include plural forms unless referred to the contrary. The meaning of "comprises" and/or "comprising" specifies a property, a region, a fixed number, a step, a process, an element and/or a component but does not exclude other properties, regions, fixed numbers, steps, processes, elements and/or components.

In addition, it will be understood that when an element such as a layer, film, region, or substrate is referred to as being "on" another element, it can be directly on the other element or intervening elements may also be present.

Also, though terms like a first, a second, and a third are used to describe various regions and layers in various embodiments of the present invention, the regions and the layers are not limited to these terms. These terms are used only to discriminate one region or layer from another region or layer.

Therefore, a layer referred to as a first layer in one embodiment can be referred to as a second layer in another embodiment. An embodiment described and exemplified herein includes a complementary embodiment thereof. Like reference numerals refer to like elements throughout.

Unless otherwise defined, all terms used herein have the same meaning as commonly understood by one of ordinary skill in the art to which this inventive concept belongs.

Hereinafter, an electronic device according to the present invention will be described with reference to the accompanying drawings.

Figure 2:
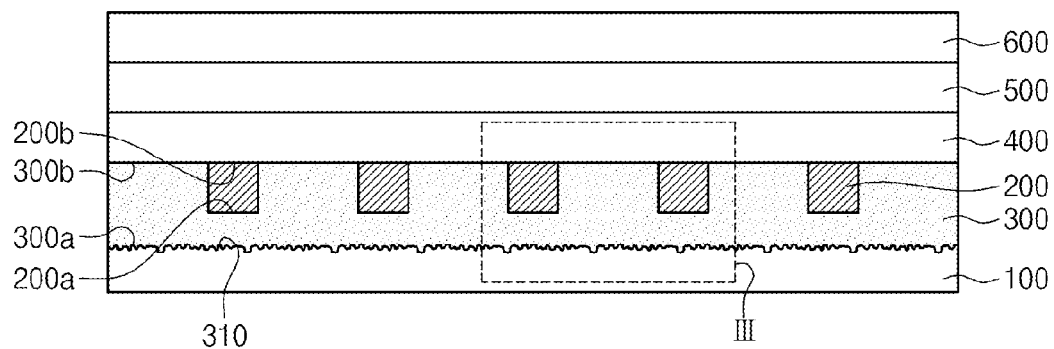
FIG. 2 is a cross-sectional view taken along line I-I' of FIG. 1.
Figure 3:
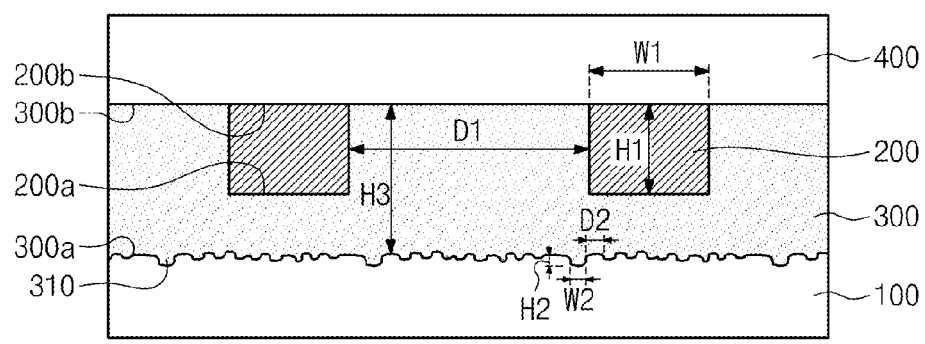
FIG. 3 is an enlarged cross-sectional view of region "III" of FIG. 2.

FIG. 1 is a plan view illustrating an electronic device according to an embodiment of the present invention. FIG. 2 is a cross-sectional view taken along line I-I' of FIG. 1. FIG. 3 is an enlarged cross-sectional view of region "III" of FIG. 2.

Referring to FIGS. 1 to 3, an electronic device 1 may include a substrate 100, auxiliary interconnections 200, a light extraction layer 300, a first electrode 400, an intermediate layer 500, and a second electrode 600. The electronic device 1 may be a device such as an organic light-emitting device, an organic information device, an organic solar cell, or an organic radio frequency identification (RFID) device.

The substrate 100 is flexible and may transmit light. The substrate 100 may be a plastic substrate. The substrate 100 may include a curable polymer, for example, polyimide, polyethylene terephthalate (PET), polycarbonate (PC), or polyethylene naphthalate (PEN).

The light extraction layer 300 may be provided on the substrate 100. The light extraction layer 300 may have a first surface 300a and a second surface 300b that are opposite to each other. Protrusions 310 may be formed on the first surface 300a. The protrusions 310 may have an irregular shape, size, and/or interval. For example, the protrusions 310 may have the shape of an irregular column and may be angled. In another example, the protrusions 310 may be irregularly rounded. Since the light extraction layer 300 has the protrusions 310, the luminous efficiency of the electronic device 1 may be improved. In another example, the light extraction layer 300 may include nanoparticles to improve a light extraction efficiency of the electronic device 1. The light extraction layer 300 may include at least one of an organic material (e.g., polyimide) and an inorganic material (e.g., titanium or zirconium). The light extraction layer 300 may have a refractive index of about 1.7 to about 2.1. As a result, the light extraction efficiency of the electronic device 1 may be improved in comparison to the case in which the light extraction layer 300 is omitted.

The auxiliary interconnections 200 may be provided in the light extraction layer 300. The light extraction layer 300 may expose an upper surface 200b of the auxiliary interconnections 200. As illustrated in FIG. 1, the auxiliary interconnections 200 may have the shape of a grid in a plane view. For example, when viewed from the top, the auxiliary interconnections 200 may include first interconnections 201 extending in one direction and second interconnections 203 extending in another direction different from the one direction. The auxiliary interconnections 200 may include a conductive material. For example, the auxiliary interconnections 200 may include a metallic material such as aluminum (Al), silver (Ag), chromium (Cr), or copper (Cu), a metal fiber material such as silver nanowires, and a carbon material such as carbon fibers or a graphene composite. The auxiliary interconnections 200 may have a lower resistance than the first electrode 400. For example, the auxiliary interconnections 200 may have a lower resistance than 10 ohm/sq. As a result, an IR drop phenomenon in the electronic device 1 may be prevented, and thus, uniform luminance of the electronic device 1 may be realized.

Referring to FIG. 3 in conjunction with FIG. 2, an average width W1 of the auxiliary interconnections 200 may be greater than an average width W2 of the protrusions 310. For example, the average width W1 of the auxiliary interconnections 200 may be in a range of about 0.1 µm to about 500 µm, and the average width W2 of the protrusions 310 may be in a range of about 100 nm to about 1,000 nm. An interval D1 between the auxiliary interconnections 200 may be greater than an average value of intervals D2 between the protrusions 310. For example, the interval D1 between the auxiliary interconnections 200 may be in a range of about 10 nm to about 100 µm, and the interval D2 between the protrusions 310 may be in a range of about 50 nm to about 5 µm. A height H1 of the auxiliary interconnections 200 may be greater than an average value of heights H2 of the protrusions 310. The height H1 of the auxiliary interconnections 200 may be in a range of about 1 µm to about 200 µm. The average height of the protrusions 310 may be in a range of about 100 nm to about 1,000 nm. The auxiliary interconnections 200 may have one surface 200*a* and another surface 200*b*. The another surface 200*b* of the auxiliary interconnections 200 may have the same or similar level to the second surface 300*b* of the light extraction layer 300 and thus, may be parallel to the second surface 300*b*. For example, the second surface 300*b* and the another surface 200*b* may have a rms roughness of about 0.01 nm to about 5 nm. The second surface 300*b* and the another surface 200*b* may have a peak to valley value of about 0.01 nm to about 20 nm. The first surface 200*a* of the auxiliary interconnections 200 may have a higher level than the first surface 300*a* of the light extraction layer 300. As a result, the first surface 200*a* may be in contact with the light extraction layer 300 and may be spaced apart from the substrate 100. The height H1 of the auxiliary interconnections 200 may be lower than a height H3 of the light extraction layer 300.

Referring again to FIG. 2, the first electrode 400 may be provided on the light extraction layer 300. The first electrode 400 may include a conductive material. For example, the first electrode 400 may include a transparent conductive oxide such as indium tin oxide (ITO), metal fibers such as silver nanowires, carbon fibers, a graphene composite, or a conductive polymer material.

The intermediate layer 500 may be provided on the first electrode 400 to cover the first electrode 400. For example, the intermediate layer 500 may act as an organic emission layer by including an organic light-emitting material. In this case, the electronic device 1 may be a device such as an organic light-emitting device or an organic RFID device. The intermediate layer 500 may further include a dopant in the organic light-emitting material. In another example, the intermediate layer 500 may act as a light absorbing layer by including a semiconductor material. In this case, the electronic device 1 may function as a solar cell by generating electrical energy from incident sunlight. The intermediate layer 500 is not limited to the above-described materials.

The second electrode 600 may be provided on the intermediate layer 500 to cover the intermediate layer 500. The second electrode 600 may include a conductive material, for example, metal. Any one of the first electrode 400 and the second electrode 600 may be a cathode, and the other one may be an anode.

Figure 4:
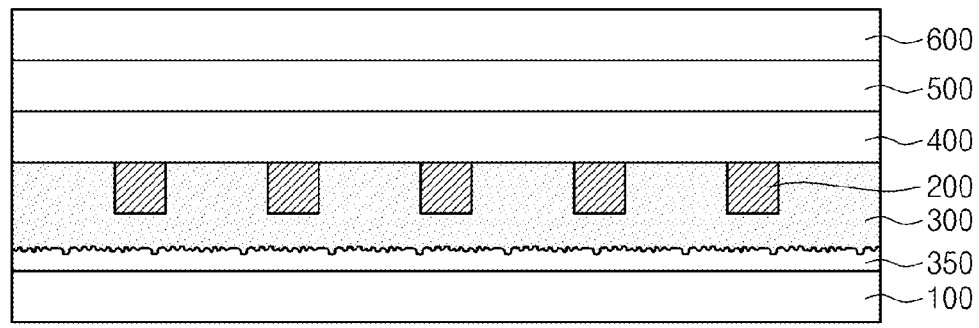
FIG. 4 is a cross-sectional view illustrating an electronic device according to another embodiment of the present invention.

FIG. 4 is a cross-sectional view illustrating an electronic device according to another embodiment of the present invention. Hereinafter, the descriptions overlapping with those described above are omitted.

Referring to FIG. 4 in conjunction with FIG. 1, an electronic device 2 may include a substrate 100, auxiliary interconnections 200, a light extraction layer 300, a first electrode 400, an intermediate layer 500, and a second electrode 600. A planarizing layer 350 may be disposed between the substrate 100 and the light extraction layer 300. A refractive index of the planarizing layer 350 may be smaller than a refractive index of the substrate 100. For example, the refractive index of the planarizing layer 350 is in a range of about 1.3 to about 1.7 and may be in a range of about 1.4 to about 1.6. A difference between a refractive index of the electronic device 2 including the planarizing layer 350 and a refractive index of the light extraction layer 300 may be increased in comparison to the case in which the planarizing layer 350 is omitted. As a result, the light-scattering ability of the electronic device 2 may increase and the light extraction efficiency thereof may be improved. The planarizing layer 350 may protect the light extraction layer 300 by planarizing the light extraction layer 300. Therefore, the degradation of electrical characteristics of the electronic device 2 including the planarizing layer 350 may be prevented in comparison to the case in which the planarizing layer 350 is omitted.

Figure 5:
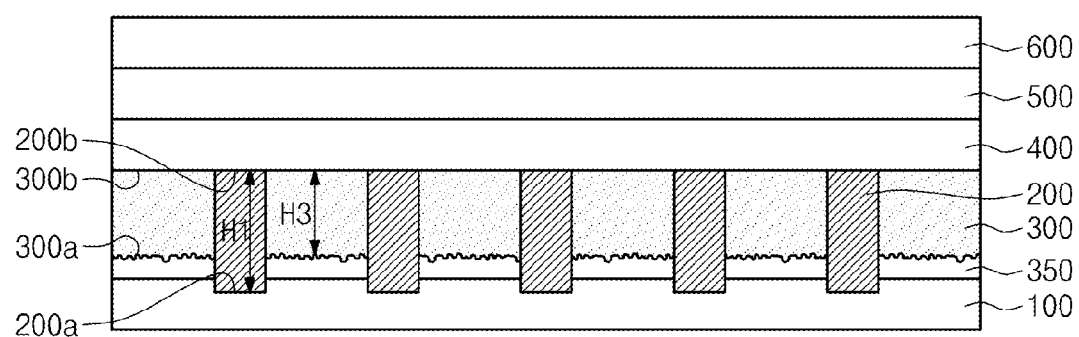
FIG. 5 is a cross-sectional view illustrating an electronic device according to another embodiment of the present invention.

FIG. 5 is a cross-sectional view illustrating an electronic device according to another embodiment of the present invention. Hereinafter, the descriptions overlapping with those described above are omitted.

Referring to FIG. 5 in conjunction with FIG. 1, an electronic device 3 may include a substrate 100, a planarizing layer 350, a light extraction layer 300, auxiliary interconnections 200, a first electrode 400, an intermediate layer 500, and a second electrode 600. In another example, the planarizing layer 350 may be omitted.

As illustrated in FIG. 1, the auxiliary interconnections 200 may have a plane having the shape of a grid. The auxiliary interconnections 200 may be provided in the light extraction layer 300. The auxiliary interconnections 200 may be in contact with the substrate 100 by extending to the substrate 100. One surface 200*a* may have the same or lower level than a first surface 300*a*. The one surface 200*a* of the auxiliary interconnections 200 may be in contact with the substrate 100. A height H1 of the auxiliary interconnections 200 may be greater than a height H3 of the light extraction layer 300. A width, the height H1, and an interval of the auxiliary interconnections 200 may be greater than average values of widths, heights, and intervals of the protrusions 310, respectively.

Figure 6:
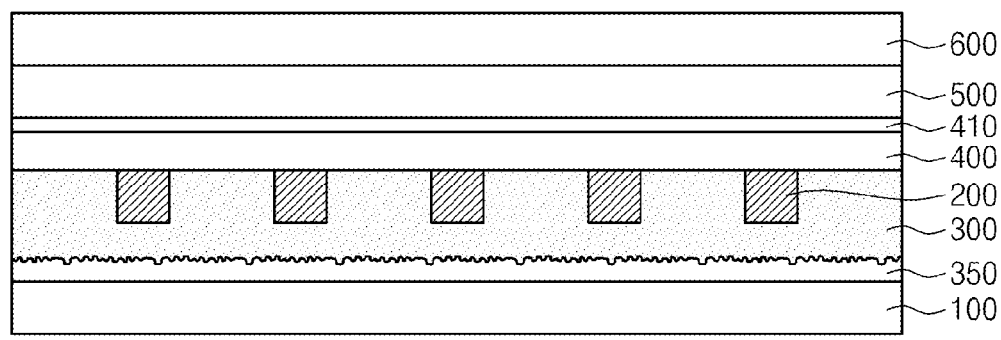
FIG. 6 is a cross-sectional view illustrating an electronic device according to another embodiment of the present invention.

FIG. 6 is a cross-sectional view illustrating an electronic device according to another embodiment of the present invention. Hereinafter, the descriptions overlapping with those described above are omitted.

Referring to FIG. 6, an electronic device 4 may include a substrate 100, a planarizing layer 350, a light extraction layer 300, auxiliary interconnections 200, a first electrode 400, a functional layer 410, an intermediate layer 500, and a second electrode 600. The substrate 100, the planarizing layer 350, the light extraction layer 300, the auxiliary interconnections 200, the intermediate layer 500, and the second electrode 600 may be the same or similar to those described as examples of FIG. 3 and/or FIG. 4. In another example, the planarizing layer 350 may be omitted.

The functional layer 410 may be disposed between the first electrode 400 and the intermediate layer 500. The functional layer 410 may improve conductivity of the first electrode 400 by including a conductive nanomaterial. The functional layer 410 may act to control work function and surface roughness of the first electrode 400. Movement and/or injection of holes between the first electrode 400 and the intermediate layer 500 of the electronic device 4 may be improved in comparison to the case in which the electronic device 4 does not include the functional layer 410.

Figure 7:
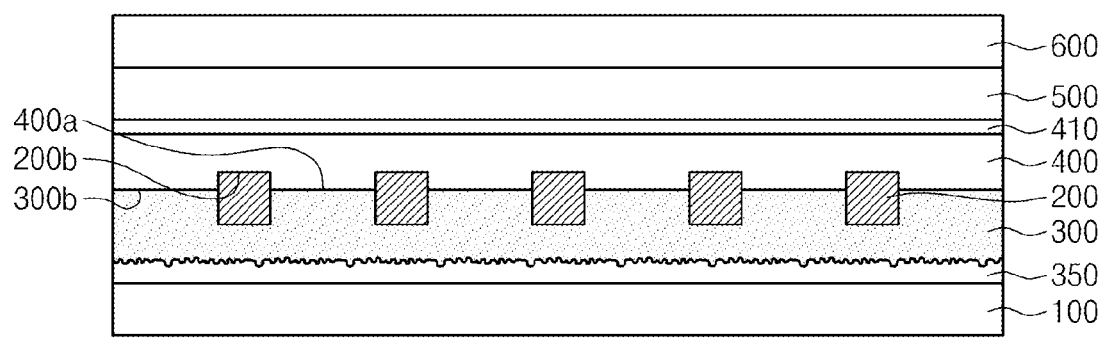
FIG. 7 is a cross-sectional view illustrating an electronic device according to another embodiment of the present invention.

FIG. 7 is a cross-sectional view illustrating an electronic device according to another embodiment of the present invention. Hereinafter, the descriptions overlapping with those described above are omitted.

Referring to FIG. 7, an electronic device 5 may include a substrate 100, a planarizing layer 350, a light extraction layer 300, auxiliary interconnections 200, a first electrode 400, a functional layer 410, an intermediate layer 500, and a second electrode 600. The auxiliary interconnections 200 and the light extraction layer 300 may be the same or similar to those described as examples of FIG. 3 and/or FIG. 4. In another example, the planarizing layer 350 may be omitted.

The first electrode 400 may be provided on the auxiliary interconnections 200 and the light extraction layer 300. The first electrode 400 may be in contact with upper portions of sides of the interconnections 200 by extending between the auxiliary interconnections 200. A lowermost surface 400a of the first electrode 400 may have a lower level than one surface 200b of the auxiliary interconnections 200. The one surface 200b of the auxiliary interconnections 200 may have a higher level than a second surface 300b of the light extraction layer 300. As a result, a contact area between the first electrode 400 and the auxiliary interconnections 200 is increased, and thus, the first electrode 400 may be well adhered to the auxiliary interconnections 200. The first electrode 400 may include the conductive material which is described as an example of FIG. 2.

Hereinafter, a method of fabricating an electronic device according to an embodiment of the present invention will be described. Hereinafter, the descriptions overlapping with those described above are omitted.

FIGS. 8 through 12 are cross-sectional views illustrating a method of fabricating an electronic device according to an embodiment of the present invention.

Figure 8:
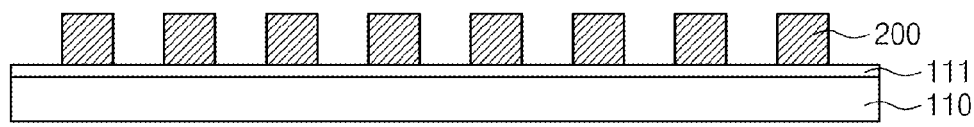
FIGS. 8 through 12 are cross-sectional views illustrating a method of fabricating an electronic device according to an embodiment of the present invention.

Referring to FIG. 8, a supporting substrate 110 including auxiliary interconnections 200 may be prepared. The supporting substrate 110 may be cleaned and plasma treated (e.g., oxygen plasma treatment). The plasma-treated supporting substrate 110 may be more hydrophilic than the supporting substrate 110 before the plasma treatment. A sacrificial layer 111 covering the supporting substrate 110 may be formed by coating the supporting substrate 110 with a polymer solution. For example, the sacrificial layer 111 may be formed by spin coating the supporting substrate 110 with a polyvinyl alcohol solution. The sacrificial layer 111 may be formed to have a thickness of about 700 nm. The auxiliary interconnections 200 may be formed by thermal evaporation, vacuum deposition (e.g., sputtering), or printing (e.g., gravure printing, electrohydrodynamic (EHD) printing, or inkjet printing). The auxiliary interconnections 200 may include a conductive material. A plane of the auxiliary interconnections 200 may have the shape of a grid as described as an example of FIG. 1. A height of the auxiliary interconnections 200 may be adjusted by a heat treatment. For example, the height of the auxiliary interconnections 200 may be in a range of about 1 μm to about 200 μm.

Figure 9:
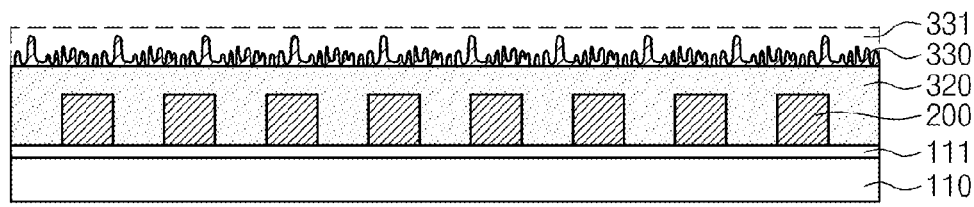

Referring to FIG. 9, a composite material layer 320 and a metal mask 330 may be formed on the supporting substrate 110. For example, an organic inorganic composite material may be prepared by mixing an organic material with an inorganic material. In this case, a polymer may be used as the organic material and an oxide, such as titanium oxide ($TiO_2$), may be used as the inorganic material. The organic inorganic composite material may have a refractive index of about 1.7 to about 2.1. The organic inorganic composite material may be coated on the auxiliary interconnections 200 to form composite material layer 320. The composite material layer 320 may be formed between the auxiliary interconnections 200 to cover the auxiliary interconnections 200. The composite material layer 320 may have a height of about 100 nm to about 1,000 nm. A metal layer 331 may be formed on the composite material layer 320. The metal mask 330 may be formed on the organic inorganic composite material layer 320 by heat treating the metal layer 331. The metal mask 330 may be formed by a dewetting phenomenon of the metal layer 331 and the composite material layer 320. The dewetting phenomenon denotes that a non-uniform pattern partially having recesses and protrusions is formed in a film which is coated with a material having dewetting properties. The metal mask 330 may have an irregular shape, size, and/or arrangement, and may expose a portion of the organic inorganic composite material layer 320. The shape and/or interval of the metal mask 330 may be controlled by adjusting a thickness, a material, and heat treatment conditions (e.g., time, temperature, and/or atmosphere) of the metal mask 330 and a material of the composite material layer 320.

Figure 10:
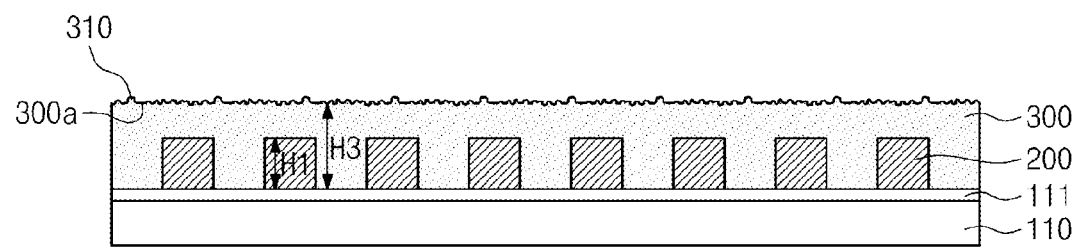

Referring to FIG. 10, a light extraction layer 300 having protrusions 310 may be formed on the auxiliary interconnections 200. For example, the light extraction layer 300 may be formed by etching the composite material layer (see 320 in FIG. 9) by using the metal mask (see 330 in FIG. 9). The protrusions 310 may be provided on a first surface 330a and may have an irregular shape, size, and/or interval. For example, a height H3 of the light extraction layer 300 may be greater than a height H1 of the auxiliary interconnections 200, and thus, the light extraction layer 300 may cover the auxiliary interconnections 200. The auxiliary interconnections 200 and the light extraction layer 300 may be the same or similar to those described as an example of FIG. 2. The metal mask (see 330 of FIG. 9) may be removed by a plasma treatment or an acid treatment to expose the protrusions 310.

Figure 11:
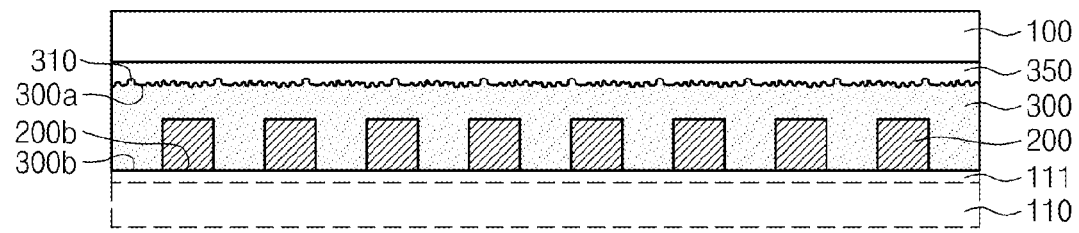

Referring to FIG. 11, a planarizing layer 350 and a substrate 100 may be sequentially formed on the light extraction layer 300. For example, a polymer may be coated on the light extraction layer 300 to form the planarizing layer 350. The planarizing layer 350 may be formed on the first surface 300a of the light extraction layer 300 to cover the protrusions 310. A refractive index of the planarizing layer 350 is in a range of about 1.3 to about 1.7 and may be in a range of about 1.4 to about 1.6. In another example, the formation of the planarizing layer 350 may be omitted. The substrate 100 may be formed on the planarizing layer 350. For example, a curable polymer may be coated on the planarizing layer 350 to form substrate 100. For example, the coating of the curable polymer may be performed by a printing method such as gravure printing, EHD printing, or inkjet printing. The curing process may be performed by irradiating light or heating. The substrate 100 may be formed to have a thickness of about 2 μm to about 400 μm. One surface 200b of the auxiliary interconnections 200 and a second surface 300b of the light extraction layer 300 may be exposed by removing the supporting substrate 110. For example, the supporting substrate 110 may be separated from the auxiliary interconnections 200 and the light extraction layer 300 by dissolving the sacrificial layer 111 in water. In this case, the second surface 300b of the light extraction layer 300 and the one surface 200b of the auxiliary interconnections 200 may have an rms roughness of about 0.01 nm to about 5 nm and/or a peak to valley value of about 0.01 nm to about 20 nm.

Figure 12:
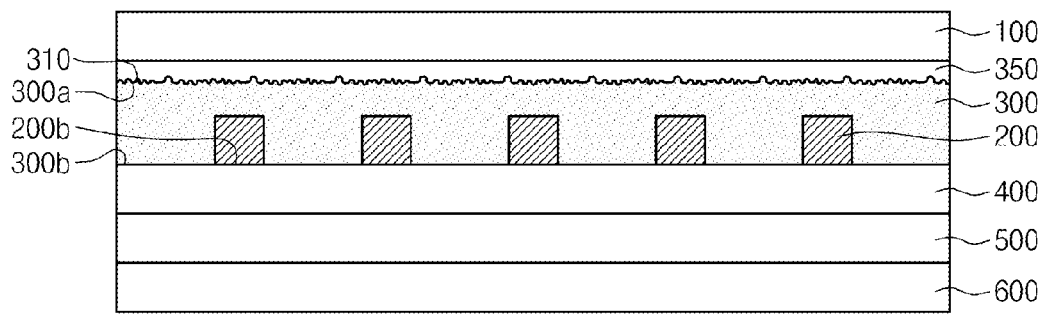

Referring to FIG. 12, a first electrode 400, an intermediate layer 500, and a second electrode 600 may be sequentially formed on the light extraction layer 300 and the auxiliary interconnections 200. Since the second surface 300b of the light extraction layer 300 is formed to be parallel to the one surface 200b of the auxiliary interconnections 200, the first electrode 400 may be well adhered to the light extraction layer 300 and the auxiliary interconnections 200. For example, a transparent conductive material such as a carbon nanotube solution may be coated on the light extraction layer 300 and the auxiliary interconnections 200 to form the first electrode 400. For example, the preparation of the carbon nanotube solution may include a preparation of a mixed solution by adding single-walled carbon nanotubes to a surfactant solution, a dispersion of the mixed solution by using a sonicator, and a separation of supernatant from the mixed solution. The first electrode 400, the intermediate layer 500, and the second electrode 600 may be the same or similar to those described as examples of FIG. 1 and FIG. 2.

Figure 13:
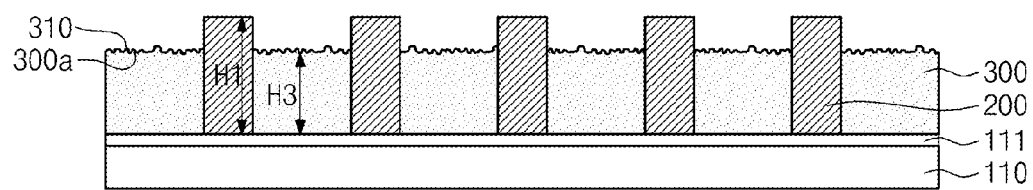
FIGS. 13 through 15 are cross-sectional views illustrating a method of fabricating an electronic device according to another embodiment of the present invention.
Figure 14:
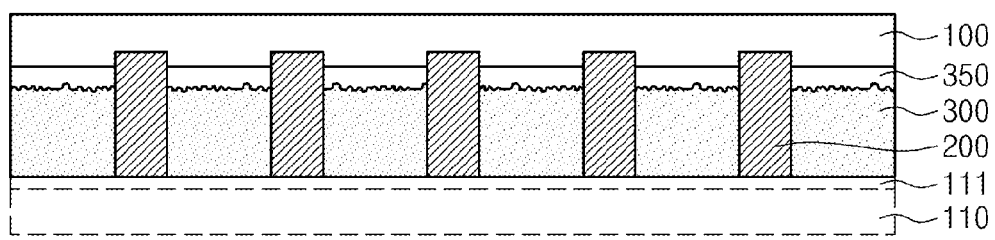
Figure 15:
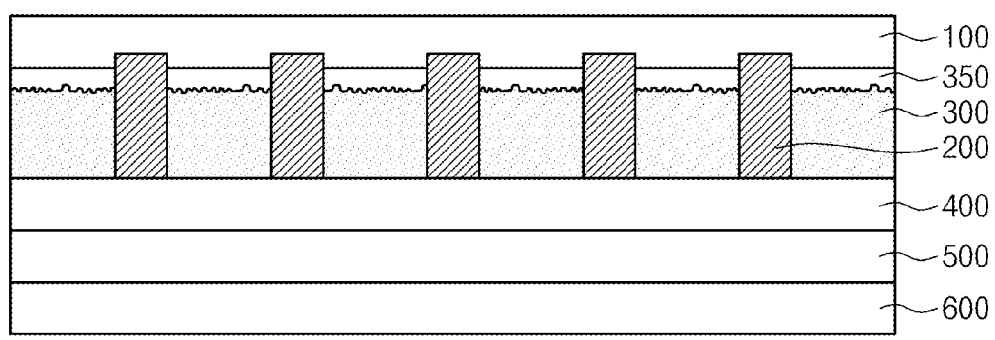

FIGS. 13 through 15 are cross-sectional views illustrating a method of fabricating an electronic device according to another embodiment of the present invention. Hereinafter, the descriptions overlapping with those described above are omitted.

Referring to FIG. 13, a supporting substrate 110 may be prepared in which a sacrificial layer 111 and auxiliary interconnections 200 are sequentially formed. A light extraction layer 300 may be formed on the supporting plate 110 to fill between the auxiliary interconnections 200. A first surface 300a of the light extraction layer 300 may be formed to have a lower level than one surface 200a of the auxiliary interconnections 200. A height H3 of the light extraction layer 300 may be lower than a height H1 of the auxiliary interconnections 200. As a result, the light extraction layer 300 may expose the one surface 200a of the auxiliary interconnections 200. The light extraction layer 300 may be formed by the same or similar method to those described as examples of FIG. 9 and FIG. 10.

Referring to FIG. 14, a planarizing layer 350 and a substrate 100 may be sequentially formed on the auxiliary interconnections 200 and the light extraction layer 300. The planarizing layer 350 and the substrate 100 may be formed by the same or similar method to those described above. The substrate 100 may cover the auxiliary interconnections 200 as well as the light extraction layer 300. The substrate 100 may be in contact with the auxiliary interconnections 200 by extending between the auxiliary interconnections 200. The sacrificial layer 111 and the supporting substrate 110 may be removed to expose the auxiliary interconnections 200 and the light extraction layer 300.

Referring to FIG. 15, a first electrode 400, an intermediate layer 500, and a second electrode 600 may be sequentially formed on the light extraction layer 300 and the auxiliary interconnections 200. The first electrode 400, the intermediate layer 500, and the second electrode 600 may be the same or similar to those described above. The fabrication of the electronic device 3 described in FIG. 5 may be completed by the above-described fabrication example.

Figure 16:
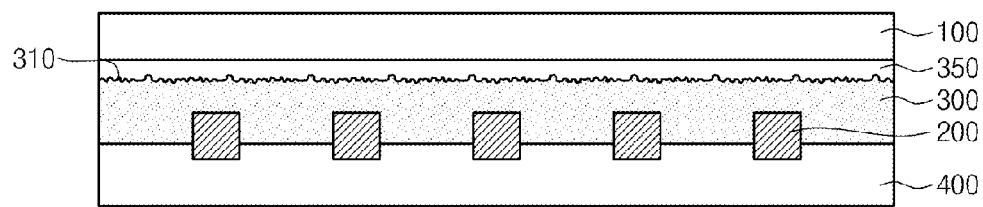
FIGS. 16 and 17 are cross-sectional views illustrating a method of fabricating an electronic device according to another embodiment of the present invention.
Figure 17:
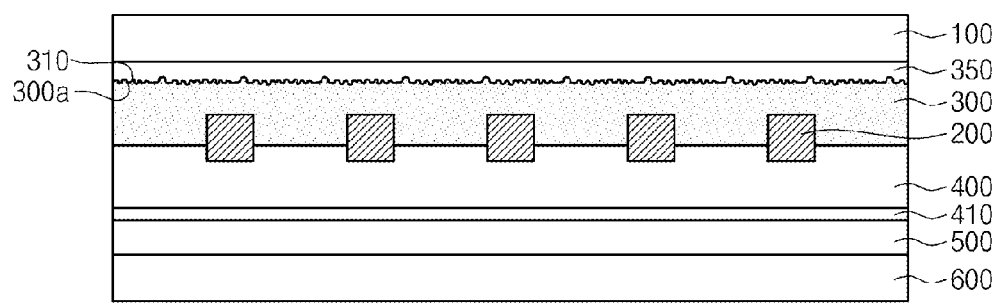

FIGS. 16 and 17 are cross-sectional views illustrating a method of fabricating an electronic device according to another embodiment of the present invention. Hereinafter, the descriptions overlapping with those described above are omitted.

Referring to FIG. 16, a first electrode 400 may be formed on a substrate 100. For example, the substrate 100 may be provided, in which a planarizing layer 350, a light extraction layer 300, and auxiliary interconnections 200 are formed. The planarizing layer 350, the light extraction layer 300, and the auxiliary interconnections 200 may be formed by the same or similar method to those described above. For example, the first electrode 400 may be formed by coating the light extraction layer 300 and the auxiliary interconnections 200 with a transparent conductive material such as a carbon nanotube solution. In this case, a volume of the auxiliary interconnections 200 may be controlled by coating the auxiliary interconnections 200 with a solvent. Alternatively, the first electrode 400 may be prepared by using a conductive material (e.g., carbon nanotubes) which is dissolved in an organic solvent such as N-methylpyrrolidone (NMP). As a result, the first electrode 400 may be in contact with at least a portion of sides of each auxiliary interconnection 200 by extending between the auxiliary interconnections 200.

Referring to FIG. 17, a functional layer 410, an intermediate layer 500, and a second electrode 600 may be sequentially formed on the first electrode 400. For example, a coating solution including titanium isopropoxide and acetylacetone may be coated on the first electrode 400 to form the functional layer 410. The formation of the intermediate layer 500 and the second electrode 600 may be the same or similar to those described as examples of FIG. 12. The fabrication of the electronic device 5 described in FIG. 7 may be completed by the above-described fabrication example.

Hereinafter, the method of fabricating an electronic device according to the concept of the present inventive will be described in more detail with reference to experimental examples of the present invention.

Experimental Examples

Fabrication of Electronic Devices

Preparation of Substrate

A glass substrate was used as a supporting substrate. The glass substrate may be cleaned and oxygen plasma-treated. A 10 wt % polyvinyl alcohol solution may be prepared by adding polyvinyl alcohol (molecular weight of about 90,000 to about 120,000, about 99% purity, Sigma-Aldrich Co. LLC) to distilled water. The glass substrate was spin-coated with the polyvinyl alcohol solution at about 1,000 rpm for about 60 seconds. A sacrificial layer was formed on the glass substrate by heat treating the glass substrate on a hot plate at about 90° C. for about 5 minutes. The sacrificial layer may have a thickness of about 700 nm.

Formation of Auxiliary Interconnections

Silver interconnections were formed by coating the sacrificial layer with silver nanopaste. The silver paste coating was performed by using a gravure offset apparatus. A thickness of the silver interconnections was controlled to be about 1 µm to about 4 µm by heat treating the silver interconnections on a hot plate for about 1 hour.

Formation of Light Extraction Layer

An organic inorganic composite material was prepared by mixing titanium oxide ($TiO_2$) and a polymer. A composite material layer was formed by coating the silver interconnections and the sacrificial layer with the organic inorganic composite material. A metal layer was deposited on the composite material layer. A metal mask was formed by heat treating the metal layer in a heating apparatus. A light extraction layer was formed by reactive ion etching of the composite material layer using the metal mask. The metal mask was removed by plasma using an acid solution, such as nitric acid, or a chlorine compound. A planarizing layer may be prepared by coating the light extraction layer with a polymer.

Formation of Substrate

The planarizing layer was coated in a liquid state with a curable polymer (noa74: Norland Optical Adhesives 74) by a doctor blade method. The coated curable polymer was cured by irradiating the planarizing layer with ultraviolet light having a wavelength of about 365 nm. As a result, a polymer substrate was formed. The sacrificial layer was removed by dipping the polymer substrate in water. Thus, the glass substrate was separated and the silver interconnections and the light extraction layer were exposed.

Formation of First Electrode, Intermediate Layer, and Second Electrode

About 1 mg of single-walled carbon nanotubes was added to about 100 ml of a surfactant solution having a concentration of 1% to prepare a mixed solution. The mixed solution was treated by using a sonicator for about 1 hour and then treated by using a centrifuge at about 1,000 rpm for about 30 minutes. A carbon nanotube solution was prepared by separating supernatant from the mixed solution. A transparent conductive layer was formed by coating the auxiliary interconnections with the carbon nanotube solution by using a spray coater. Thereafter, the transparent conductive layer was cleaned with distilled water to remove the surfactant solution remaining on a surface thereof. About 50 mg of titanium isopropoxide was added to about 30 mg of acetylacetone and stirred for about 1 hour to prepare a coating solution. A first electrode may be formed by coating the transparent conductive layer with the coating solution by a sol-gel method. An intermediate layer and a second electrode may be sequentially formed on the first electrode. An electronic device of the present experimental example had a width of about 360 cm.

Formation of First Electrode, Intermediate Layer, and Second Electrode

About 1 mg of single-walled carbon nanotubes was added to about 100 ml of a surfactant solution having a concentration of 1% to prepare a mixed solution. The mixed solution was treated by using a sonicator for about 1 hour and then treated by using a centrifuge at about 1,000 rpm for about 30 minutes. A carbon nanotube solution was prepared by separating supernatant from the mixed solution. A transparent conductive layer was formed by coating the auxiliary interconnections with the carbon nanotube solution by using a spray coater. Thereafter, the transparent conductive layer was cleaned with distilled water to remove the surfactant solution remaining on a surface thereof, and thus, the preparation of a first electrode was completed. About 50 mg of titanium isopropoxide was added to about 30 mg of acetylacetone and stirred for about 1 hour to prepare a coating solution. A functional layer may be formed by coating the first electrode with the coating solution by a sol-gel method. An intermediate layer and a second electrode may be sequentially formed on the functional layer. An electronic device of the present experimental example had a width of about 360 cm.

Comparative Example

An electronic device was prepared in the same manner as in the experimental example. However, in the comparative example, the formation of metal interconnections and a light extraction layer are omitted.

Figure 18:
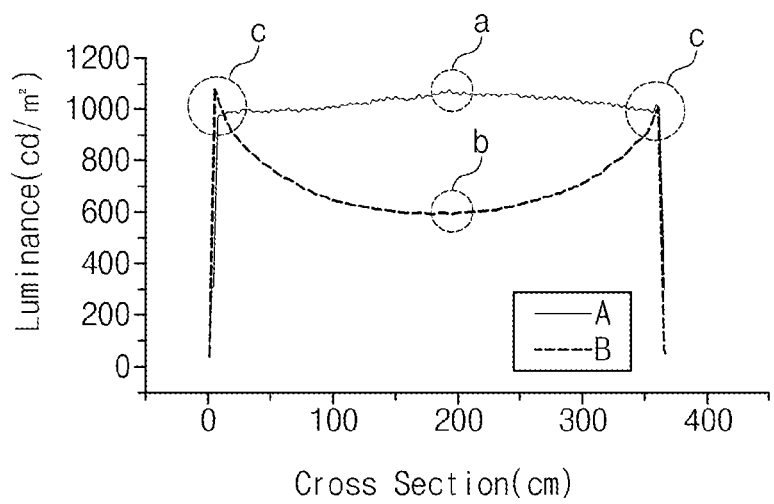
FIG. 18 is a graph illustrating the results of evaluating brightness of a comparative example and an experimental example of the present invention.

FIG. 18 is a graph illustrating the results of evaluating brightness of the comparative example and the experimental example of the present invention. The evaluation of the brightness was performed by measuring the brightness of the electronic devices of the comparative example and the experimental example according to cross-sectional areas thereof while power was provided to edges of the electronic devices.

Referring to FIG. 18 in conjunction with FIG. 3, it may be understood that Experimental Example A exhibited more uniform brightness than Comparative Example B. With respect to Comparative Example B, it may be confirmed that brightness in center b was lower than brightness at edges c due to an IR drop phenomenon. The expression "IR drop" denotes that a voltage difference between region c and regions a and b, which are respectively close to and far from a part through which power is input, occurs in the electronic device 1. With respect to Experimental Example A, the IR drop phenomenon may be prevented due to the auxiliary interconnections 200 having a lower resistance than the first electrode 400. As a result, it may be confirmed in Experimental Example A that the brightness of the center a was the same or similar to the brightness of the edges c. Electrical properties of the electronic device 1 of the present invention may be improved and uniform light emission may be realized.

An electronic device of the present invention may include auxiliary interconnections provided in a light extraction layer. The light extraction layer may improve a light extraction efficiency of the electronic device by including irregular protrusions. The auxiliary interconnections may include a material having a lower resistance than a first electrode. Electrical properties of the electronic device including the auxiliary interconnections may be improved in comparison to the case in which the auxiliary interconnections are omitted, and thus, uniform brightness may be realized.

According to a method of fabricating an electronic device of the present invention, a flexible substrate may be easily formed on the light extraction layer.

While preferred embodiments of the present invention has been particularly shown and described with reference to the accompanying drawings, it will be understood by those of ordinary skill in the art that various changes in form and details may be made therein without departing from the spirit and scope of the present invention as defined by the following claims.

What is claimed is:

1. A method of fabricating an electronic device, the method comprising:

providing a supporting substrate in which auxiliary interconnections are formed;

forming a light extraction layer on the supporting substrate, wherein the light extraction layer fills between the auxiliary interconnections and has a first surface and a second surface that is opposite to the first surface, wherein the second surface faces the supporting substrate;

forming a substrate on the first surface of the light extraction layer;

removing the supporting substrate to expose the second surface of the light extraction layer; and sequentially forming a first electrode, an intermediate layer, and a second electrode on the second surface of the light extraction layer.

2. The method of claim 1, wherein the removing of the supporting substrate comprises exposing the auxiliary interconnections, and the first electrode is in contact with the auxiliary interconnections and the second surface of the light extraction layer.

3. The method of claim 1, wherein the forming of the light extraction layer comprises forming protrusions having an irregular size or shape on the first surface, wherein the protrusions have a narrower average width than the auxiliary interconnections.

4. The method of claim 1, wherein the auxiliary interconnections have:
one surface facing the substrate; and
another surface that is opposite to the one surface and parallel to the second surface of the light extraction layer.

5. The method of claim 4, wherein the one surface of the auxiliary interconnections is spaced apart from the substrate by having a lower level than the first surface of the light extraction layer.

6. The method of claim 1, wherein a refractive index of the light extraction layer is in a range of 1.7 to 2.1.

7. The method of claim 1, wherein the light extraction layer has a lower height than the auxiliary interconnections, and
the auxiliary interconnections are in contact with the substrate by extending to the substrate.

8. The method of claim 1, wherein the forming of the substrate further comprises forming a planarizing layer covering the first surface of the light extraction layer.

9. The method of claim 8, wherein a refractive index of the planarizing layer is in a range of 1.3 to 1.7.

10. The method of claim 1, wherein the forming of the light extraction layer comprises:
forming a composite material layer on the supporting substrate;
forming a metal layer covering the composite material layer;
forming a mask exposing the composite material layer by heat treating the metal layer; and
forming protrusions by etching the composite material layer.

11. An electronic device comprising:
a substrate;
auxiliary interconnections disposed on the substrate;
a light extraction layer that is provided on the substrate and fills between the auxiliary interconnections;
a first electrode provided on the auxiliary interconnections and the light extraction layer; and
an intermediate layer and a second electrode that are sequentially stacked on the first electrode,
wherein the light extraction layer has a first surface in direct contact with the substrate and a second surface opposite to the first surface, the first surface has protrusions, and the auxiliary interconnections comprise a material having a lower resistance than the first electrode.

12. The electronic device of claim 11, wherein the first electrode is in contact with the auxiliary interconnections and the light extraction layer, and
the light extraction layer exposes an uppermost surface of the auxiliary interconnections.

13. The electronic device of claim 11, wherein the protrusions have an irregular shape, size, or interval.

14. The electronic device of claim 11, wherein a width of the auxiliary interconnections is greater than an average width of the protrusions.

15. The electronic device of claim 11, wherein a lowermost surface of the auxiliary interconnections is spaced apart from the substrate.

16. The electronic device of claim 11, wherein the second surface has a higher level than a lowermost surface of the auxiliary interconnections, and
the auxiliary interconnections are in contact with the substrate by extending into the substrate.

17. The electronic device of claim 11, further comprising a functional layer disposed between the first electrode and the intermediate layer,
wherein the first electrode extends between the auxiliary interconnections.

18. The electronic device of claim 11, wherein a refractive index of the light extraction layer is in a range of 1.7 to 2.1.

19. The electronic device of claim 11, further comprising a planarizing layer that is disposed between the substrate and the light extraction layer to cover the protrusions,
wherein a refractive index of the planarizing layer is in a range of 1.3 to 1.7.

* * * * *